(12) United States Patent
Yang et al.

(10) Patent No.: US 10,608,830 B2
(45) Date of Patent: Mar. 31, 2020

(54) POWER OVER FIBER ENABLED SENSOR SYSTEM

(71) Applicant: MH GoPower Company Limited, Kaohsiung (TW)

(72) Inventors: Mei-huan Yang, Kaohsiung (TW); Cheng-liang Wu, Kaohsiung (TW); Terry Zahuranec, North Olmsted, OH (US); Remigio Perales, Oberlin, OH (US); Kun-Hsien Chen, Kaohsiung (TW); Wei-sheng Chao, Kaohsiung (TW); Ying-lin Tseng, Kaohsiung (TW); Te-chih Huang, Kaohsiung (TW); Jheng-syuan Shih, Kaohsiung (TW); Mu-kai Su, Kaohsiung (TW)

(73) Assignee: MH GOPOWER COMPANY LIMITED, Kaohsiung (TW)

( * ) Notice: Subject to any disclaimer, the term of this patent is extended or adjusted under 35 U.S.C. 154(b) by 0 days.

(21) Appl. No.: 15/888,293

(22) Filed: Feb. 5, 2018

(65) Prior Publication Data
US 2018/0227133 A1 Aug. 9, 2018

Related U.S. Application Data

(60) Provisional application No. 62/455,384, filed on Feb. 6, 2017.

(51) Int. Cl.
*H04L 12/10* (2006.01)
*H04Q 9/00* (2006.01)
*H01L 31/0687* (2012.01)

(52) U.S. Cl.
CPC ............... *H04L 12/10* (2013.01); *H04Q 9/00* (2013.01); *H01L 31/0687* (2013.01); *H04Q 2209/823* (2013.01); *H04Q 2209/883* (2013.01); *H04Q 2209/886* (2013.01)

(58) Field of Classification Search
CPC ................................. H04L 12/10; H04Q 9/00
USPC ...................................................... 340/870.39
See application file for complete search history.

(56) References Cited

U.S. PATENT DOCUMENTS

| 3,264,463 | A | 8/1966 | Bonner |
| 4,617,513 | A | 10/1986 | Reinhardt |
| 4,643,545 | A | 2/1987 | Vanderwall |
| 5,124,689 | A | 6/1992 | Franz et al. |

(Continued)

FOREIGN PATENT DOCUMENTS

| CN | 203813793 U | 9/2014 |
| TW | 201703273 A | 1/2017 |

OTHER PUBLICATIONS https://www.nrel.gov/docs/fy01osti/26789.pdf.

(Continued)

*Primary Examiner* — Albert K Wong
(74) *Attorney, Agent, or Firm* — Pearne & Gordon LLP

(57) ABSTRACT

The disclosure generally relates to power over fiber technology configured to provide electrical power and communications via fiber to one or more sensors of one or more varieties. More particularly, the disclosure relates to a sensor system comprising a laser data module operatively connected to a powered sensor module, wherein the powered sensor module receives a light, converts the light to electrical power, and powers a sensor with the electrical power, and wherein the powered sensor module transmits signals from the sensor to a laser data module.

39 Claims, 9 Drawing Sheets

(56) References Cited

U.S. PATENT DOCUMENTS

| | | | |
|---|---|---|---|
| 5,128,269 A | 7/1992 | Oitate et al. | |
| 5,258,868 A | 11/1993 | Jensen et al. | |
| 5,319,356 A | 6/1994 | Yoshino | |
| 5,396,180 A | 3/1995 | Hampton et al. | |
| 5,475,312 A | 12/1995 | Sedding et al. | |
| 5,525,976 A | 6/1996 | Balgard | |
| 5,528,409 A | 6/1996 | Cucci et al. | |
| 5,585,915 A | 12/1996 | Kurosawa et al. | |
| 5,598,509 A | 1/1997 | Takahashi et al. | |
| 5,627,941 A | 5/1997 | Takahashi et al. | |
| 5,664,035 A | 9/1997 | Tsuji et al. | |
| 5,771,114 A | 6/1998 | Andersson et al. | |
| 5,859,590 A | 1/1999 | Otani | |
| 5,859,719 A * | 1/1999 | Dentai | H04B 10/807 257/82 |
| 6,063,997 A | 5/2000 | Endo et al. | |
| 6,249,385 B1 | 6/2001 | Yamazaki et al. | |
| 6,300,768 B1 | 10/2001 | Kato et al. | |
| 6,707,614 B2 | 3/2004 | Tanaka | |
| 6,932,496 B2 | 8/2005 | Rizkin et al. | |
| 6,940,380 B1 | 9/2005 | Leijon | |
| 6,955,324 B2 | 10/2005 | Tanielian | |
| 7,188,997 B2 | 3/2007 | Tillman et al. | |
| 7,253,602 B2 | 8/2007 | Shvach et al. | |
| 7,344,266 B2 | 3/2008 | Coman | |
| 7,469,105 B2 | 12/2008 | Wake et al. | |
| 7,532,792 B2 | 5/2009 | Skovgaard et al. | |
| 7,538,948 B2 | 5/2009 | Muenz et al. | |
| 7,604,399 B2 | 10/2009 | Twerdochlib et al. | |
| 7,605,712 B2 | 10/2009 | Twerdochlib et al. | |
| 7,638,750 B2 | 12/2009 | Kline | |
| 7,646,308 B2 | 1/2010 | Paoletti et al. | |
| 7,696,901 B2 | 4/2010 | Wilson et al. | |
| 7,813,646 B2 | 10/2010 | Furey | |
| 7,855,671 B2 | 12/2010 | Dura et al. | |
| 7,859,071 B2 | 12/2010 | Levinson | |
| 7,864,429 B2 | 1/2011 | Muenz et al. | |
| 7,909,508 B2 | 3/2011 | Maloney et al. | |
| 7,941,022 B1 | 5/2011 | Schaffner et al. | |
| 7,965,948 B1 | 6/2011 | Bugash et al. | |
| 8,294,477 B2 | 10/2012 | Handshoe et al. | |
| 8,395,397 B1 | 3/2013 | Handshoe et al. | |
| 8,788,119 B2 | 7/2014 | Tillotson et al. | |
| 8,842,995 B2 | 9/2014 | Chan et al. | |
| 8,866,486 B2 | 10/2014 | Grieshaber et al. | |
| 8,981,945 B2 | 3/2015 | McNamara et al. | |
| 9,027,407 B2 | 5/2015 | Chommeloux | |
| 9,390,067 B2 | 7/2016 | Gamacho Vecino et al. | |
| 9,482,697 B2 | 11/2016 | Javora et al. | |
| 9,488,629 B2 | 11/2016 | Xu et al. | |
| 2004/0159102 A1 | 8/2004 | Toyomura et al. | |
| 2005/0052728 A1 * | 3/2005 | Akasaka | H04B 10/2916 359/334 |
| 2005/0061361 A1 | 3/2005 | Ochi et al. | |
| 2006/0003780 A1 | 1/2006 | Mamdani et al. | |
| 2006/0076946 A1 | 4/2006 | Shvach et al. | |
| 2006/0202109 A1 * | 9/2006 | Delcher | H04B 10/806 250/214 R |
| 2007/0036484 A1 | 2/2007 | Hyatt | |
| 2009/0272420 A1 | 11/2009 | Kare | |
| 2011/0290992 A1 * | 12/2011 | Sato | G01V 8/02 250/253 |
| 2012/0266803 A1 | 10/2012 | Zediker et al. | |
| 2013/0205906 A1 | 8/2013 | Chommeloux et al. | |
| 2014/0318629 A1 | 10/2014 | Gieskes | |
| 2017/0005216 A1 | 1/2017 | Yang et al. | |

OTHER PUBLICATIONS https://www.scribd.com/document/152818650/Conventional-and-Unconventional-Optical-Partial-Discharge-Method-Using-Fluorescent-Fibre-Sensor-and-Monitoring-the-Intensity-of-the-Transmitted-Ligh.
http://www.abb.com/cawp/seitp202/f8e7a4a7e7496bddc125792900742d15.aspx.
https://cdn.selinc.com/assets/Literature/Product%20Literature/Flyers/751_751A_ArcFl.
https://fibergratings.com/sensors.html.
https://ieeexplore.ieee.org/document/7548579/?arnumber=7548579.
http://www.oalib.com/paper/170924#.WIZyVXyQw-U.
http://comunidadeaton.com/wp-content/uploads/2014/05/05-Metal-Clad-Switchgear-VacClad-W-Medium-Voltage.pdf.
Temperature Solutions of HYEC, Sengenuity Sensory Engines by Vectron International brochure; 2017; Homg Yu Electric Co., Ltd.
IntelliSAW Critital Asset Monitoring brochure.
Wang ,et al; Power-Over-Fiber Technique based Sensing System for Internet of Things; 2016 15th International Conference on Optical Communications and Networks (ICOCN).

* cited by examiner

POWER OVER FIBER ENABLED SENSOR SYSTEM

CROSS-REFERENCE TO RELATED APPLICATIONS

The present application claims priority to U.S. Provisional Application 62/455,384, titled PARTIAL DISCHARGE SENSOR MODULE SYSTEM, filed Feb. 6, 2017, which is herein incorporated by reference.

BACKGROUND

The disclosure generally relates to power over fiber technology having the ability to provide electrical power and communications via fiber to one or more sensors of one or more varieties. More particularly, the disclosure relates to a sensor system capable of producing electrical power by using a photovoltaic power converter and at least one sensor.

Power over fiber (PoF) technology supplies power via light (e.g. laser light, LED light, etc.) sent through fiber optic cables to a photovoltaic power converter (PPC) that converts the laser light into a continuous supply of electrical power for sensors and other electrical devices. Light is sent through a non-conductive fiber optic cable (to provide power) to a destination where the transmitted laser light is then converted to electricity by the PPC. The non-conductive fiber optic cable provides benefits such as high voltage isolation, electrical noise immunity, lightning strike risk reduction, and light weight.

Sensors are often required in remote places, away from an easily available source of power, or are required in locations that are hazardous or hard to reach, or in high voltage or electrically noisy environments. Conventional techniques of providing power to these sensors include batteries, copper wire (when voltage isolation or noise immunity is not required), isolation transformers, as well as energy harvesting techniques. These techniques each suffer from limitations including operating duration (e.g. battery life), noise sensitivity (e.g. copper wire and isolation transformers), and low power levels (e.g. low battery power or energy harvesting).

Partial discharge (PD) is a phenomena that occurs when air on a conductor or insulator is ionized, thus resulting in corona (i.e., current flow through the ionized air), or when discharges occur between conductors. PD can degrade the insulation and other components within switchgear cabinets, electrical cabinets, motors, transformers, generators or other high or medium voltage compartments or electrical devices, insulators, substations, and other areas, and can lead to catastrophic arc flash events. Such failures in switchgear or similar devices can cause power outages, equipment damage, and injury.

More particularly, switchgear cabinets generally have multiple high voltage (HV) compartments, each compartment housing different equipment serving a different function. Generally, PD events are most likely to occur at locations where insulation material degrades, but they can also occur at points of mechanical connections and other such locations that are subject to mechanical wear. Within a switchgear cabinet, these mechanical connections may be where bus bars make connections and/or where physical contacts are made (such as for breakers or switches). Temperature and humidity are both factors that lead to electrical accidents within switchgear cabinets. High temperatures are indicative of electrical current overloads or high impedance, which can be a sign or the cause of insulation breakdown, while high humidity contributes to the rapid deterioration of insulation.

For switchgear cabinets, PD is traditionally measured by antennas that are placed within high voltage compartments, typically on a wall. These antennas "listen" for acoustic events (e.g. sound that is generated from sparking), or detect UHF signals generated by a PD event. When a PD event is detected, a corresponding signal from the detecting sensor is transmitted back to a data controller and processed for monitoring. While the earlier-described partial discharge (PD) detection systems are able to detect when PD events occur, they cannot detect where an event occurs, for example within a high voltage (HV) compartment. Further, in light of the above-described damage caused by PD, it is beneficial to more closely monitor PD events in order to repair or replace damaged components, which if left unattended may lead to arc flashes, explosion, or fire. However, in some locations, such as within switchgear cabinets, conventional PD sensors (acoustic or UV) are unable to get close to the likely location of the PD event, or easily measure the PD event, thus limiting traditional PD monitoring ability.

For example, in circuit breaker compartments, breaker arms make physical contact with a "contactor" having mechanical fingers that compress around a breaker arm, thus allowing current to flow across the connection. Such mechanical connection points are locations that are prone to PD due to the wear and tear and the loosening of parts through repeated use, or through imprecise manufacturing leading to current flow and voltage imbalances. PD events here can result in possible catastrophic arc flash failure. Significant challenges exist in detecting PD events in such locations, as the connection points are surrounded by a breaker arm enclosure that absorbs or attenuates the typical PD indicators (acoustic and UHF signals) that the PD antenna is detecting. As such, conventional PD solutions are less likely to detect low intensity PD events within a circuit breaker compartment. Further, conventional solutions are not able to detect the precise location (e.g. the breaker connection) where the PD event generated.

These limitations with the conventional detection approaches are, in part, due to regulations limiting the use of low voltage (LV) wiring into HV compartments for some classes of equipment, or in electrically noisy environments. Even in cases where regulations allow a PD antenna/sensor to be located within a HV compartment, a system that receives power through low voltage wiring cannot be placed directly on a HV bus bar or connection point without significant precautions and expense to reduce the risk of ground faults. Accordingly, PD antennas and sensors (and other sensor types) are traditionally located on a compartment wall, outside of the breaker arm enclosure, as described above. Further, the above-described sensor systems have historically not been able to measure all the parameters that lead to an arc flash in these environments. Therefore, the ability to develop failure patterns, and thus, to suggest preventative maintenance prior to a failure developing has been limited.

BRIEF SUMMARY

In a first aspect is a sensor system. The sensor system comprises a laser data module; a powered sensor module comprising a photovoltaic power converter; and a first sensor mounted internally or externally to the powered sensor module. The powered sensor module receives a light, converts the light to electrical power, and powers the first sensor with the electrical power. The powered sensor module is configured to transmit signals from the first sensor to the laser data module.

In an example of the first aspect, the powered sensor module is operatively connected to the laser data module via a fiber optic cable.

In another example of the first aspect, the laser data module comprises a light source, wherein the light source is a continuous laser, a pulsed laser or an LED.

In yet another example of the first aspect, the first sensor is selected from the group consisting of: an ambient temperature sensor, a surface temperature sensor, an electromagnetic radiation sensor, a light sensor, a humidity sensor, an acoustic sensor, an ultrasonic sound sensor, a pressure sensor, a vibration sensor, a magnetic field sensor, an electrical signal sensor, a flow rate sensor and a fiber sensor.

In still another example of the first aspect, the first sensor is a light sensor comprises a first photodetector that detects ultraviolet light and a second photodetector that detects visible light.

In still another example of the first aspect, the first sensor is a contact acoustic sensor or an airborne acoustic sensor.

In an example of the first aspect, the first sensor transfers data using a digital signal processor integrated circuit configured to reduce the data transfer rate.

In another example of the first aspect, the powered sensor module further comprises a memory and a system processor configured to transfer select data samples or specific time bands of data and to combine the data from multiple sensor inputs.

In another example of the first aspect, the photovoltaic power converter comprises a photovoltaic cell which can be a vertical multi junction photovoltaic cell.

In yet another example of the first aspect, the laser data module is located in a low voltage compartment and the powered sensor module is located in a medium or high voltage compartment, which can be compartments of a switchgear cabinet. The laser data module can alternatively be mounted directly on a bus bar or proximate to mechanical fingers of a breaker arm.

In an example of aspect 1, the sensor system can comprise a plurality of sensors.

In another example of the first aspect, the powered sensor module detects a sensed condition. The powered sensor module can detect, in particular, the directionality of the sensed condition.

In still another example of the first aspect, the sensor system can determine a location, time, intensity, and/or duration of a sensed condition.

In another example of aspect 1, the powered sensor module further comprises additional energy storage.

In an example of the first aspect, the first sensor is mounted internally within the powered sensor module to directionally point towards a detection location. In some examples, the first sensor extends thru a housing of the powered sensor module to directionally point towards the detection location.

In another example of the first aspect, the powered sensor module further comprises one or more externally located sensors positioned or directed to be closer to a detection location than is the powered sensor module.

In yet another example of the first aspect, the powered sensor module further comprises a housing including a metal shield on the inside of the housing. The metal shield can be configured to allow external signals to reach the sensor.

In another example of the first aspect, the laser data module simultaneously powers and monitors output from the powered sensor module. In some examples, the sensor system comprises a second powered sensor module, wherein the powered sensor modules are configured to operate at different power levels and data communication rates.

In yet still another example of aspect 1, the powered sensor module operates in low power mode between each sensor reading.

In another example still, the laser data module further comprises a signal processor configured to interpret sensor data and alert when specified threshold limits are exceeded.

In another example of the first aspect, the powered sensor module further comprises a signal processor configured to interpret sensor data and alert when specified threshold limits are exceeded. In some examples, the powered sensor module comprises a plurality of signal processors, wherein at least one signal processor is configured to simultaneously interpret data from multiple sensors and alert when specified threshold limits are exceeded, and wherein at least one signal processor is utilized for external communications. In some examples, one of the signal processors is configured to interpret sensor signals from one or more sensors and to further process the signals to determine when fiber breaks or disconnects have occurred.

In yet another example of the first aspect, a continuous stream of data is provided to the laser data module from the powered sensor module. In some examples, the laser data module is configured to detect a loss of data, wherein the loss of data signals a break or disconnect of a fiber optic cable. And in some examples, the laser data module is configured to terminate or fails to initialize power upon the loss of data.

In another example of aspect 1 still, the laser data module comprises a class 4 laser which is spilt into multiple lower power, for example, Class 1 laser channels. In some aspects, the output of the multiple lower power Class 1 laser channels can be configured to provide different power levels to a plurality of powered sensor modules based on a need of the powered sensor modules during operation. And in some examples, the an output of the multiple lower power Class 1 laser channels can be configured to provide varying power levels to a plurality of powered sensor modules based on a need of the powered sensor modules during operation.

In a second aspect is a sensor system comprising a laser data module operatively connected to a powered sensor module via a fiber optic cable. The laser data module comprises a light source, which could be a laser light source. The powered sensor module comprises a photovoltaic power converter. The powdered sensor module receives a light from the light source and converts the light to electrical power. The electrical power is then used to power sensors or other electronics that are operatively connected to the sensor module.

In one example of the second aspect, the powered sensor module is configured to provide electrical power to a first sensor.

In another example of the second aspect, the first sensor is configured separately and is added to the system by the end user.

BRIEF DESCRIPTION OF THE DRAWINGS

The above and other features, examples and advantages of aspects or examples of the present disclosure are better understood when the following detailed description is read with reference to the accompanying drawings, in which.

DETAILED DESCRIPTION OF THE DRAWINGS

Figure 1:
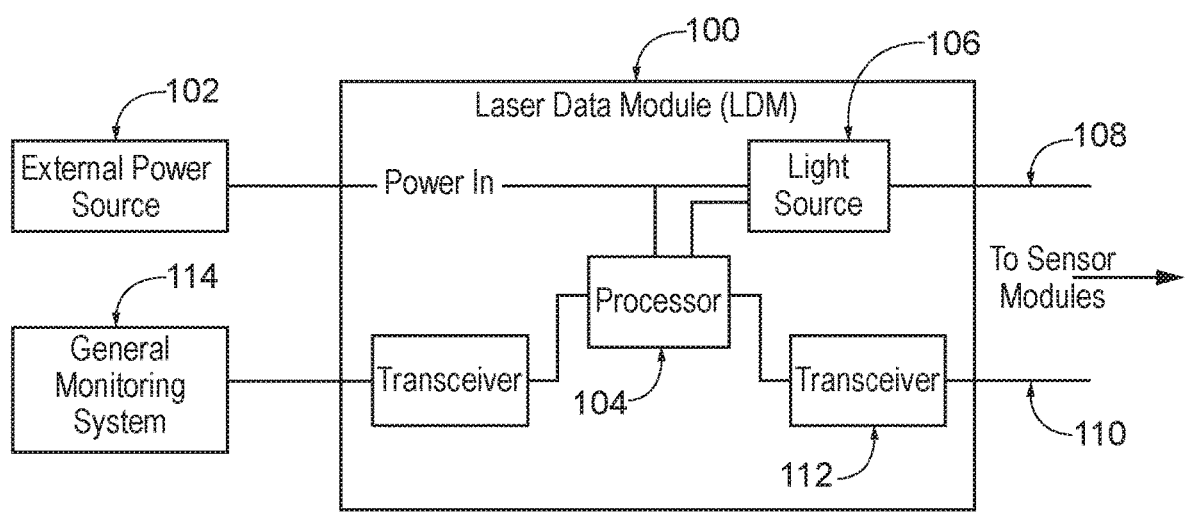
FIG. 1 is a schematic view of an example laser data module of a sensor system.

In view of the above limitations of conventional PD event detection ability, the present disclosure describes a sensor module system utilizing power over fiber (PoF) that can simultaneously provide power and communications via fiber to one or more sensors, of one or more varieties in different locations, including within hazardous, hard to reach, high voltage or electrically noisy environments. By way of example, a PoF sensor module system for detection of temperature, humidity, and partial discharge (PD) within switchgear equipment is described herein. Of course, it is noted that although the description herein is largely specific to a PD monitoring system, the use of the system for other applications and with other sensor types is within the scope of the present disclosure.

More particularly, the PoF sensor module system described herein includes a laser data module (LDM) that provides PoF to one or more connected sensor modules. Each sensor module can be located on separate bus bars, proximate to the mechanical fingers of a breaker arm, or in separate breaker arm enclosures, near a PD event, as examples (or in other medium and high voltage locations), as well as more generally in any location where it may be difficult or suboptimal to receive power via conventional techniques. The sensor modules of the present disclosure include powered sensors that detect a variety of sensed conditions, including PD events, changes in surface or ambient temperatures and humidity, UV and visible emissions, acoustics, vibrations, and pressures, and transmit that detected information back to the LDM over a data fiber. The LDM can process data from the sensors and relay the analysis to a data monitoring system. The monitoring system may be located in or near the module itself or it may be remotely located.

With the above, the system described herein is able to detect lower intensity PD events than can traditional acoustic or UHF PD sensors mounted on compartment walls instead of directly on high voltage areas like bus bars. The system described herein is further able to determine where (e.g., on which bus bar or at which breaker connection) the PD event occurred. This also allows for an earlier detection of PD events so the equipment can be scheduled for preventative maintenance, thus avoiding unscheduled equipment downtime or plant shutdowns due to arc flash or similar catastrophic failures. The advantages of early detection and more sensitive sensor detection can be extrapolated to other sensor types operating in noisy environments, or in environments where, prior to PoF, sensing in close proximity to the event was difficult, or even impossible to obtain. As an example, PoF powered temperature sensors can be placed on high voltage bus bars, providing continuous bus bar temperature monitoring.

Power Over Fiber (PoF)

PoF technology supplies power via a laser or other light source through fiber optic cables (also referred to herein as a power fiber optic cable) to a photovoltaic power converter which converts the laser light into a continuous supply of electrical power. Light is provided through a non-conductive fiber optic cable (to provide power) to a destination where the transmitted laser light is converted to electricity. The non-conductive fiber optic cable provides very high voltage isolation and electrical noise immunity, ensuring sensor reading data integrity and accuracy.

Laser Data Module

Figure 2:
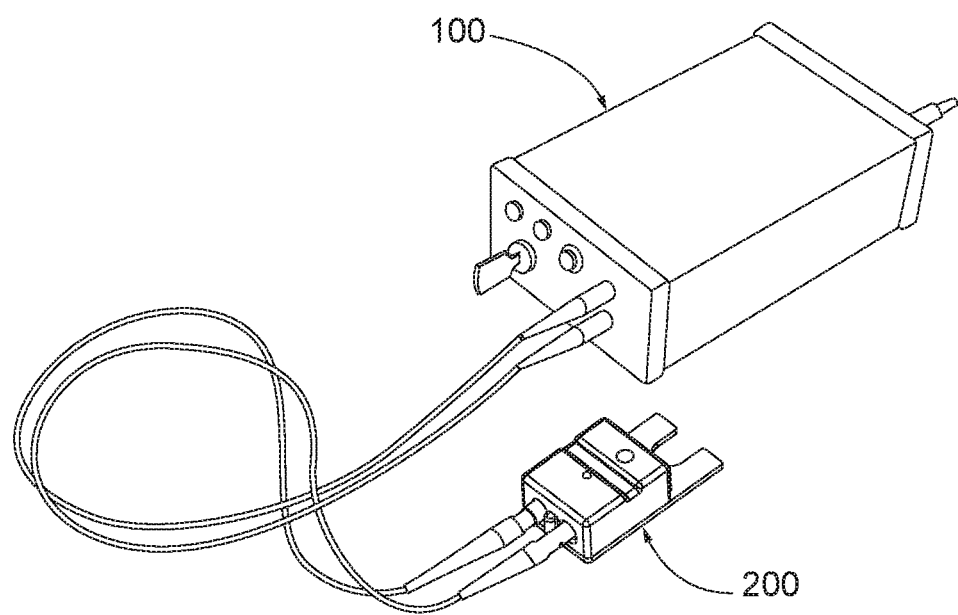
FIG. 2 is a perspective view of an example laser data module connected to an example sensor of the sensor system described herein.

An example laser data module is illustrated in FIGS. 1 and 2. As applied to the system herein, a laser data module (LDM) 100 is electrically powered (e.g., from an external power source 102) and includes one or more processor(s) 104 and a light source 106. The light source 106 may be, for example, a continuous or pulsed source laser, an LED, or any other light source that is coupled into a power fiber cable 108. Preferably, a laser output power is about 1.25 W and has a center wavelength of about 976 nm, however these parameters may be adjusted for particular applications.

The LDM 100 can be located in a low voltage (LV) compartment (when needed to comply with ANSI standards) or in a medium or high voltage area (when regulations allow) of a switchgear cabinet or other area being monitored. In other embodiments, the LDM 100 may also be located external to the compartment or area being monitored. As noted above, the upstream LDM 100 supplies power to the sensor modules 200 via a power fiber optic cable 108. The LDM 100 can receive sensor readings from the sensor module 200 through a data fiber optic cable (or fiber optic cable) 110, and in some embodiments may also send commands to sensor module 200 over the data fiber optic cable 110. Communication between the LDM 100 and the sensor module 200 may be bi-directional via a transceiver 112, or the LDM 100 may be configured to only receive sensor data from the sensor module 200. One or more transceivers 112 may generate optical data for transmission through data fiber optic cable 110 via an LED or other light source. In embodiments utilizing an LED, it preferably outputs light having 45 µW at an 850 nm center wavelength for transmission at 115,200 bps over an RS-485 interface. Power and data may also be transmitted through the same fiber optic cable. Alternatively, power may be transmitted via a fiber optic cable 108, while data may be transmitted to/from the sensor module 200 via a wireless transceiver (not shown).

The processor 104 of the LDM 100 may be used to control a power supply and operation of the light source 106, and may further include or be associated with memory for data storage of sensor data or control signals from the LDM 100. The processor 104 may also be configured to combine (e.g. multiplex) sensor data received from the sensor module(s) 200 over the data fiber 110 to the LDM 100, analyze the received data and transmit the analysis to a monitoring system 114, and/or pass through the sensor data to the monitoring system 114. As part of the analysis, the processor 104 can determine the occurrence, location, time, and other properties of PD events (or other sensed conditions) that may result from complex signal processing to detect and characterize the events. This can be an analysis of intensities, durations, locations, number of events, and the like of the sensed conditions. Further, the processor 104 and/or monitoring system 114 can be configured to monitor changes of PD events (or other event types) and conditions over a period of time to determine, for example, a progression of events and conditions. The processor 104 can also correlate information from multiple sensors and/or multiple sensor modules 200. The analysis can be performed in real time. The LDM 100 can simultaneously power the sensor module 200 and monitor its output. In its capacity to monitor output, the signal processor 104 of the LDM 100 can be configured to interpret data from the powered sensor module 200 and alert when specified threshold limits such as intensity, intensity duration, location, number of events, or frequency of events are exceeded. Because these threshold limits are application specific, they can be determined on a case-by-case basis by the end user. The system can be configured to recognize desired thresholds for a particular application and also to respond appropriately. Since partial discharge can indicate the beginning of insulation degradation, the operator may choose to schedule a shut-down to repair the equipment, or instead may choose to monitor for activity progression over time, providing the ability to provide long-term monitoring and information between the monitored environmental conditions and equipment health.

This data stream from the sensor module 200 may be analyzed at the LDM 100 or at a central monitoring system 114 as described above to determine the occurrence or possibility of PD or other events. The data stream may also be analyzed to detect and monitor that the fiber optic cables 108, 110 are connected properly, not damaged, installed correctly, and other malfunctions. If a malfunction is detected, the sensor system may terminate or not initialize power to the light (laser) source 106. By providing a continuous stream of data at a known speed to the LDM 100, the LDM 100 is able to detect a loss of data, and thus determine when a fiber break or disconnect has occurred. If a loss of data is detected for a pre-configured amount of time, the LDM 100 can terminate or not initialize power to the light source upon loss of data. The response time to this determination may be on the order of milliseconds or less. In this manner, the sensor system is a single fault tolerant system that allows higher power Class 4 lasers to be used in and rated as lower power systems, such as a Class 1 laser system. In one embodiment, this feedback loop also may have the ability to vary the power to the laser rather than shut it down completely, and thus adjust the laser output power, as needed.

While it is understood that the outer dimensions of the LDM 100 may be determined by the physical constraints/parameters of a particular application, according to one embodiment, the LDM 100 generally takes the shape of a rectangular prism having total outer dimensions of about 57 mm height, 107 mm width, and 166 mm length.

Sensor Module

Figure 3:
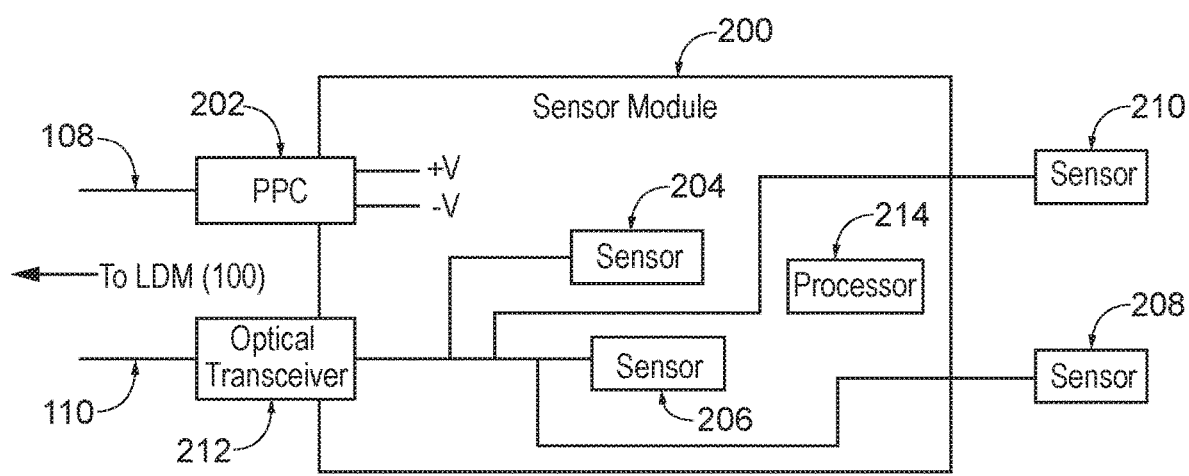
FIG. 3 is a schematic view of an example sensor module of the sensor system described herein.
Figure 4:
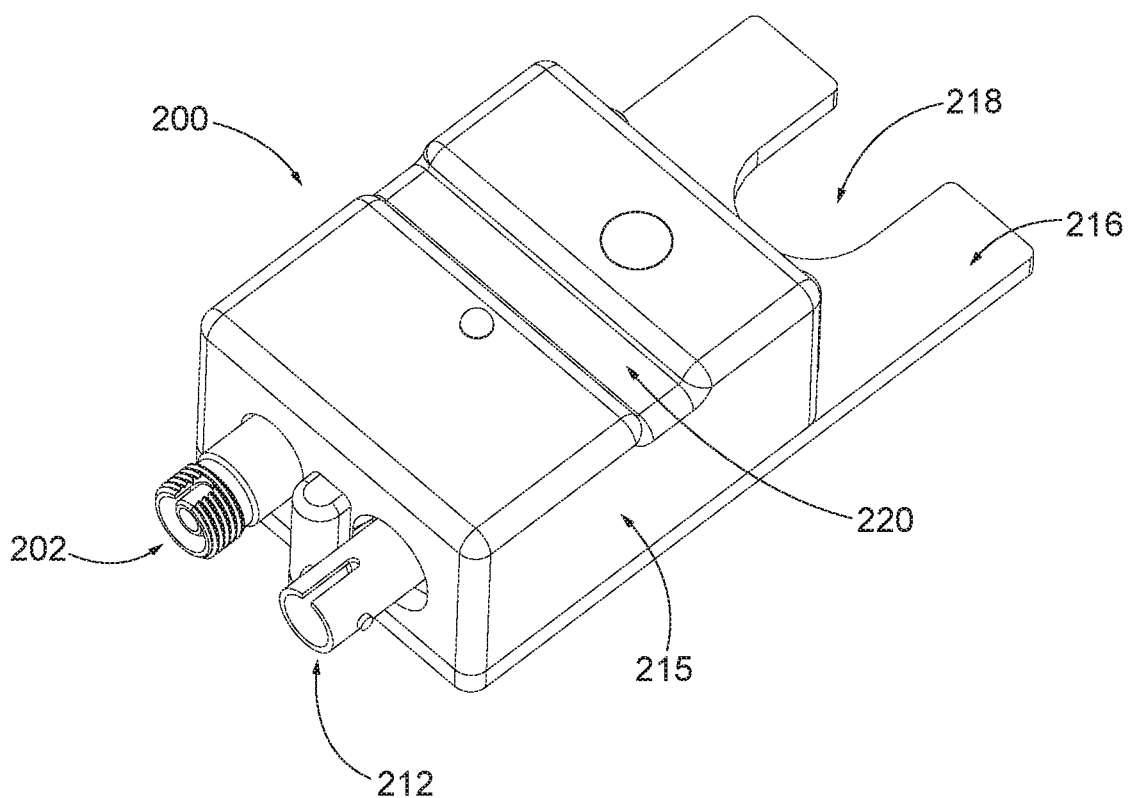
FIG. 4 is a perspective view of an example sensor module of the sensor system described herein.

Example sensor modules and their features are illustrated in FIGS. 2, 3 and 4. As described above, FIG. 2 is a perspective view of an LDM 100 connected to a sensor module 200. With respect to FIG. 3, a schematic view of a sensor module 200 according to a first embodiment is illustrated. The sensor module 200, which is located downstream of the LDM 100, includes a photovoltaic power converter (PPC) receiver 202 that converts the light received from the power fiber optic cable 108 into electrical power.

The elements of the sensor module 200 are contained in a housing 215. Depending on the embodiment, the housing 215 may made of plastic and may be transparent or translucent, opaque, or a combination thereof (e.g., an opaque housing with transparent or translucent window therein). The housing 215 may also have a groove 220 for tie wrap mounting. In some embodiments, the housing 215 may rest on or be attached (e.g., with screws or glue) to a base 216. As illustrated in FIG. 4, the base 216 can extend beyond the housing 215 in at least one dimension. The base 216 may be metallic to provide a ground plane. The base 216 may also have an arcuate-shaped cutout 218, or the like, to facilitate mounting of the sensor module 200 to a monitored device (e.g., a bus bar).

While it is understood that the outer dimensions of the sensor module 200 may be determined by the physical constraints/parameters of a particular application, according to one embodiment, the total height of the base 216 and housing 215 is about 22 or 23 mm, the width of the sensor module 200 is about 37 mm, the total length of the sensor module 200 (including the portion of the base 216 extending beyond the housing 215) is about 71 mm with the base 216 extending beyond the housing 215 by about 23 mm and the housing 215 being about 48 mm long, and the width of the cutout is about 14 mm. The connectors 202, 212 may extend from the housing 215 by about 10.5 mm and be spaced apart from each other by about 8 mm. According to another embodiment, the total height of the base 216 and housing 215 is about 19 mm, with the base 216 representing about 2 mm, the width of the sensor module 200 is about 33.5 mm, the total length of the sensor module 200 is about 74 mm with the base 216 extending beyond the housing 215 by about 23 mm and the housing 215 being about 50 mm long, the width of the cutout is about 14 mm and the length of the cutout is about 17 mm.

Figure 5:
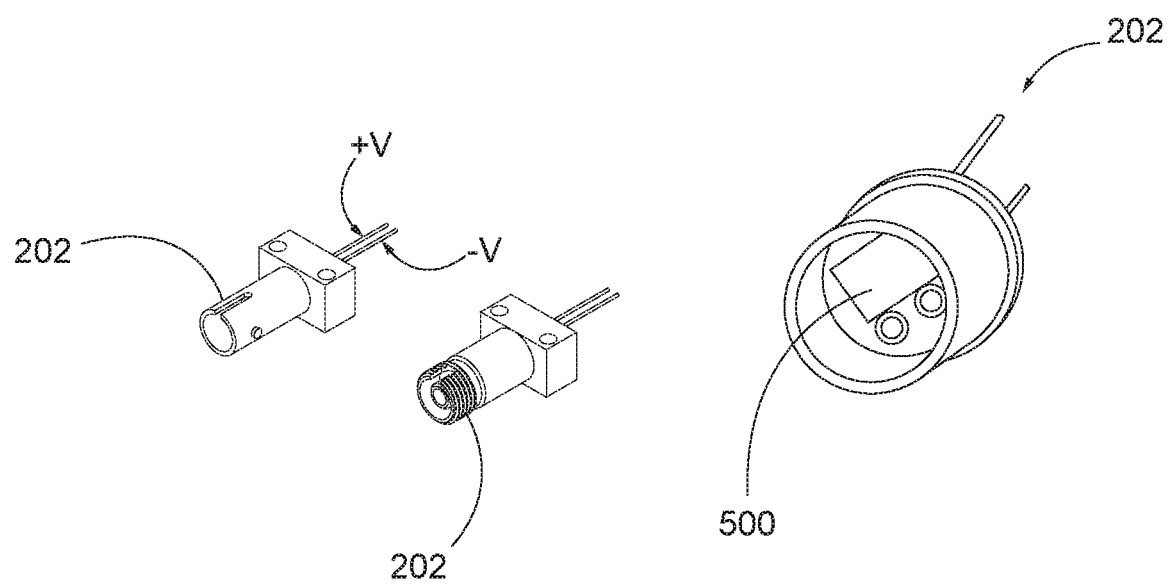
FIG. 5 is a perspective and inside view of a photovoltaic power converter of a sensor module.

As seen in FIG. 5, the PPC 202 can include a photovoltaic cell 500 for converting the light to electricity. The photovoltaic cell 500 may be, for example, a vertical multi junction (VMJ) photovoltaic cell (VMJ PV cell) or other photovoltaic cell material types and/or device constructions. The PPC 202 provides power to the sensor module 200 so that sensors 204, 206, 208, 210 operatively connected to the sensor module 200, can continuously monitor conditions and events (e.g., ambient temperature, humidity, vibration, pressure, bus bar temperature (temperature of surface mounted to), partial discharge, arc flash, and the like). The sensor module can be operatively connected to one sensor or to a plurality of sensors, wherein the sensors may detect one or more variables independently or in combination. The PPC 202 is preferably integrated with and included in a female FC connector for a fiber optic cable 108. In this manner, the power optic cable 108 may be plugged into a connector that is external to the sensor module 200, which can, in turn, output electrical power (+V, −V) to the interior of the sensor module for power distribution. As seen in FIG. 5, a photovoltaic cell 500 of the PPC 202 may be included at the back of the connector to receive light from the power cable 108. The output of the cell 500 is connected to the +V and −V terminals of the PPC connector 202.

In the case of a PPC 202 utilizing one or more VMJ PV cells 500, the PPC's voltage output is based on the voltage output of the VMJ PV cell 500, which is dependent upon the number of junctions within the VMJ PV cell. The width of the VMJ PV cell depends upon the number of junctions of the PV cell. A VMJ PV cell's voltage output as an example, may be nominally 6V, or 18V, or a different voltage, depending on the number of junctions. Furthermore, the voltage output of the PPC 202 may also vary depending on the operating conditions, including the input light intensity and the cell temperature.

VMJ PV cells, or other PV cell types, may be mounted to a heatsink, or other package which may help to dissipate heat as well as provide electrical connections to the cell for power output. The VMJ PV cell junctions may be perpendicular to the heatsink (e.g., copper heat pipe), or packaging. In an example configuration, the VMJ cell is about 0.3 mm (0.012 in) thick and is mounted to a ceramic substrate (of e.g., aluminum-nitride) that is about 0.74 to 7.6 mm (0.0290 to 0.300 in) thick via an about 0.4 mm (0.0015 in) thick thermal epoxy (of, e.g., boron-nitride). The substrate is then mounted to the heatsink with another about 0.4 mm (0.015 in) thick thermal epoxy.

The powered sensor module 200 can also contain or be in close proximity to an optical transceiver 212 that receives commands from the LDM 100 and sends collected sensor data back to the LDM 100 via the data fiber optic cable 110. Of course, the sensor module 200 may instead contain a transmitter to send its sensor data back to the LDM 100 if it does not need to receive commands from the LDM 100. For wired embodiments, the sensor module 200 preferably includes a female ST connector, into which the transceiver can be integrated, to interface with the data fiber optic cable 110. The powered sensor module 200 may also communicate wirelessly with the LDM 100, or with a wireless transceiver located outside of the LDM 100.

The sensor module 200 may also include additional energy storage so to have the capability to store power for later use (e.g., with a battery or capacitor, not shown) or to vary the data communication rates to so as to reduce communication rates, which, in turn, reduces energy consumption. For some sensors, temperature as an example, low sampling rates may be sufficient to provide the necessary monitoring information. Low sampling and transmission rates require lower power consumption, and therefore help to reduce the amount of laser power input required. Sensor sampling rate may also be lowered for the specific purpose of more easily achieving Class 1 laser safety compliance. Of course, higher sampling rates may be desirable and can be used if preferred.

In some embodiments, the sensor system according to the present disclosure comprises a plurality of sensor modules 200. In one embodiment, the powered sensor modules 200 can be configured independently or collectively and operated at different power levels and to provide data to the LDM 100 at different communication rates. Depending on the communication rates selected for each signal, including both incoming signals and outgoing signals, the powered sensor module 200 can operate in low power mode between each transmittal. Finally, the sensor module 200 may combine the data from multiple sensor signals into the transmitted data stream.

In some embodiments power input to the sensor module 200 may be directly connected/distributed to the various sensors 204, 206, 208, 210 associated with the sensor module 200. Similarly, the transceiver 212 may be directly connected to the sensors 204, 206, 208, 210. However, other embodiments may utilize a processor 214 in the sensor module 200 for further processing of commands from the LDM 100 and signals from elements of the sensor module 202. In such embodiments, the system processor 214 can be configured to transfer all data or select data samples. Alternatively, it can be configured to select, process and transfer data from specific time bands. Data from multiple sensor inputs can be combined prior to transfer or data can be transferred discretely. In its capacity to monitor output from, e.g. sensors, the signal processor 214 of the sensor module 200 can be configured to interpret data from one or more attached sensors 204, 206, 208, 210 and alert when specified threshold limits, such as those described above, are exceeded and/or when fiber breaks or disconnects have occurred.

In some embodiments, the powered sensor module 200 comprises a plurality of signal processors 214. In this configuration, at least one signal processor 214 simultaneously detects and interprets data from multiple sensors, and can alert when specified threshold limits are exceeded and/or when fiber breaks or disconnects have occurred. When multiple signal processors 214 are present, one signal processor can be used for external communications, such as communications to the LDM 100.

Applications

Utilizing the above described PoF-based sensor module system, sensor modules 200 can thus be used in high voltage areas such as medium-high voltage switchgear for monitoring bus temperatures, humidity, or other parameters in order to prevent arc flash from occurring in the equipment. While the sensor system described herein is generally described with respect to switchgear cabinets, it also can be used on other equipment where sensing is needed in areas where high electromagnetic interference (EMI) conditions are present, where high voltage isolation is needed, where high voltage electrical power is managed or distributed, and/or where the location is an enclosure or difficult to access area, as well as on equipment in hazardous environments, in switches, in transformers, in motors or rotating machines, in electrical or electromechanical systems, in lightning protection systems, and the like. In view of this, the LDM 100 can preferably operate in hazardous conditions and between about −20° C. and 70° C., and sensor modules 200 can preferably also operate in hazardous conditions and between about −40° C. and 120° C.; and both can preferably operate in conditions where humidity is between about 10% and 95%.

Further, in such equipment, because changing conditions may lead to an arc flash due to the high voltages (as an example, in systems with voltages between 5 kV and 38 kV, such as 5 kV, 10 kV, 27 kV, or 38 kV systems, as well as other higher or lower voltage level systems), it is desirable to eliminate metallic wires and isolate the power source for the device. Herein when a range such as between 5 kV and 38 kV is given, this means at least 5 kV, and separately and independently, not more than 38 kV, and includes all values in between. Values with such a range, for example 10 kV, 15 kV or 20 kV, are also separately and independently included in the same manner as the lower and upper end of the disclosed range.

Figure 6:
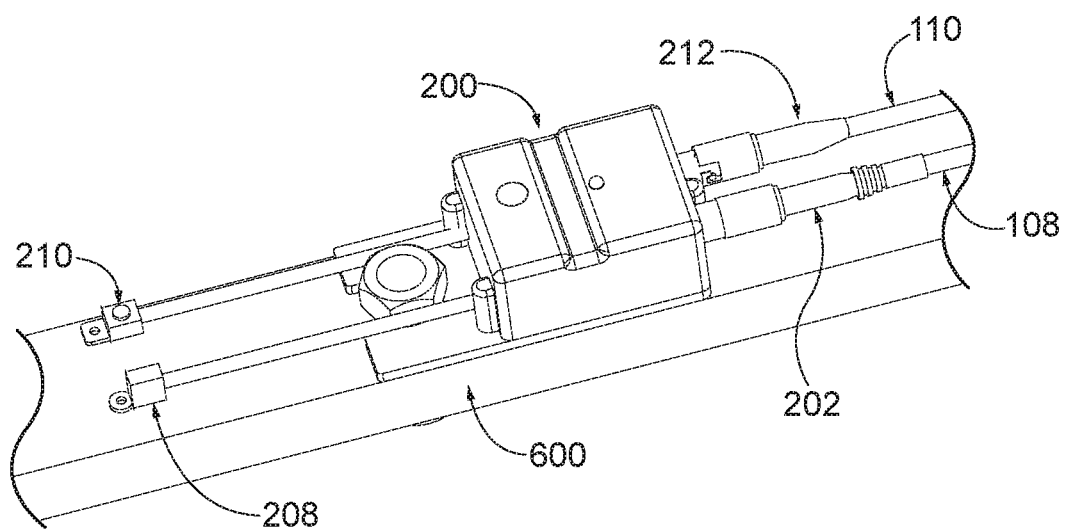
FIG. 6 is a perspective view of a sensor module having external sensors and mounted to a bus bar.

Given the above configuration for a PoF system, the sensor modules 200 can be totally electrically isolated and EMI immune, and therefore can be installed in medium or high voltage areas, and in direct contact with bus bars, which is not possible with traditional monitoring systems. For example, in one embodiment, the sensor module 200 includes a metal shield (such as an aluminum screen) on the inside of the housing 215 to provide EMI shielding of electronics. The inclusion of an opening in the metal shield allows external signals to reach the sensor within the shielded sensor module 200. Further, the sensor modules 200 can fit inside a breaker arm enclosure (or similar small, confined, hard to reach, narrow, or enclosed space, such as within medium or high voltage electrical equipment) while still communicating with the monitoring system thru the data fiber optic cable 110. In addition, if the enclosed space or hard to reach area requires a sensor smaller than the sensor module 200, the sensors 208, 210 can be extended from the sensor module 200 to reach into smaller spaces. For example, as noted above, sensors 208, 210 can be located exterior to the sensor module. Such a configuration is illustrated in FIG. 6, where the sensor module 200 is mounted to, for example, a breaker bar 600. The external sensors may, as an example, be of any of the sensors described herein. These external sensors may also include optical fibers, light pipes, directional lens, or fiber sensors as required by the circumstances of the application. This system achieves the above while complying with standards (e.g., ANSI) and regulations.

Sensor modules 200, and/or the sensors 208, 210 extended from the sensor module may be attached onto or encased within insulation, metal, epoxies, or other materials to gain access or contact to surfaces, devices, or locations that are typically encased with protective materials, and therefore non-accessible to traditional sensor configurations. As an example, solid insulating bus bar systems encase bus bars with insulation. A sensor module 200 may be mounted to the bus bar prior to the bus bar being encased with the insulating material. The fiber optic cables could be run underneath the insulation material, or could penetrate the insulation material near the sensor module, and continue to the LDM 100 external to the insulation.

Figure 7:
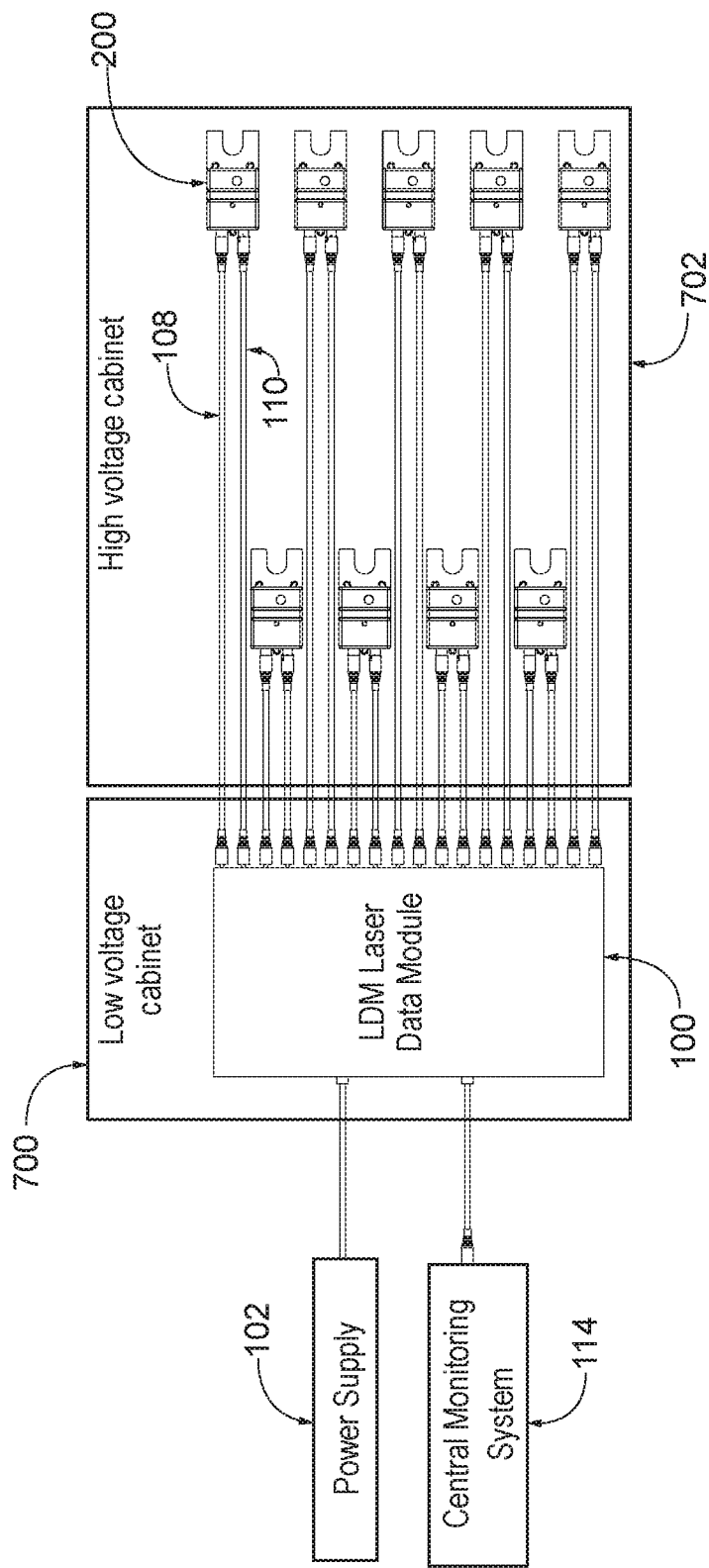
FIG. 7 is a schematic illustration of example connections between a laser data module and a plurality of sensor modules of a sensor system.

FIG. 7 illustrates the configuration of a sensor module system described herein, where the LDM 100 is located in a low voltage cabinet 700 and the sensor modules are located in a high voltage cabinet 702. According to the illustrated embodiment, the LDM 100 can split a single high power laser source (light source 106) therein into multiple fiber optic channels of lower power laser light to power multiple sensor modules 200 from the same light source 106, thereby increasing system reliability and reducing components. Splitting the light source 106 output into multiple lower power channels prior to exiting the LDM 100 simplifies achieving a Class 1 designation for the system by reducing the level of exposure which may occur due to a fiber break external to the LDM 100 housing. Alternatively, the LDM 100 may include multiple light sources within the LDM 100, and each laser source may itself have its output split into multiple lower power fiber optic laser channels (either internally, or externally of the LDM 100 housing).

The sensor modules 200 can be connected at various distances from the LDM 100 depending on the length of cables 108, 110. As such configurations utilize a plurality of sensors and sensor modules 200, the LDM 100 may also combine the data channel readings from each of the sensor modules for communicating the sensor modules/equipment conditions remotely (e.g., to a central monitoring system 114). For example, the LDM 100 can also be configured with a plurality of transceivers 112 for communicating data over each data fiber optic cable 110. Of course, this data could be (de-)multiplexed between the transceiver 112 and each sensor module 200, or the transceiver 112 may share a common line with each sensor module 200 whereby data related to each sensor module 200 is encoded/decoded by the LDM 100, central monitoring system 114, and/or the respective sensor module 200.

Figure 8:
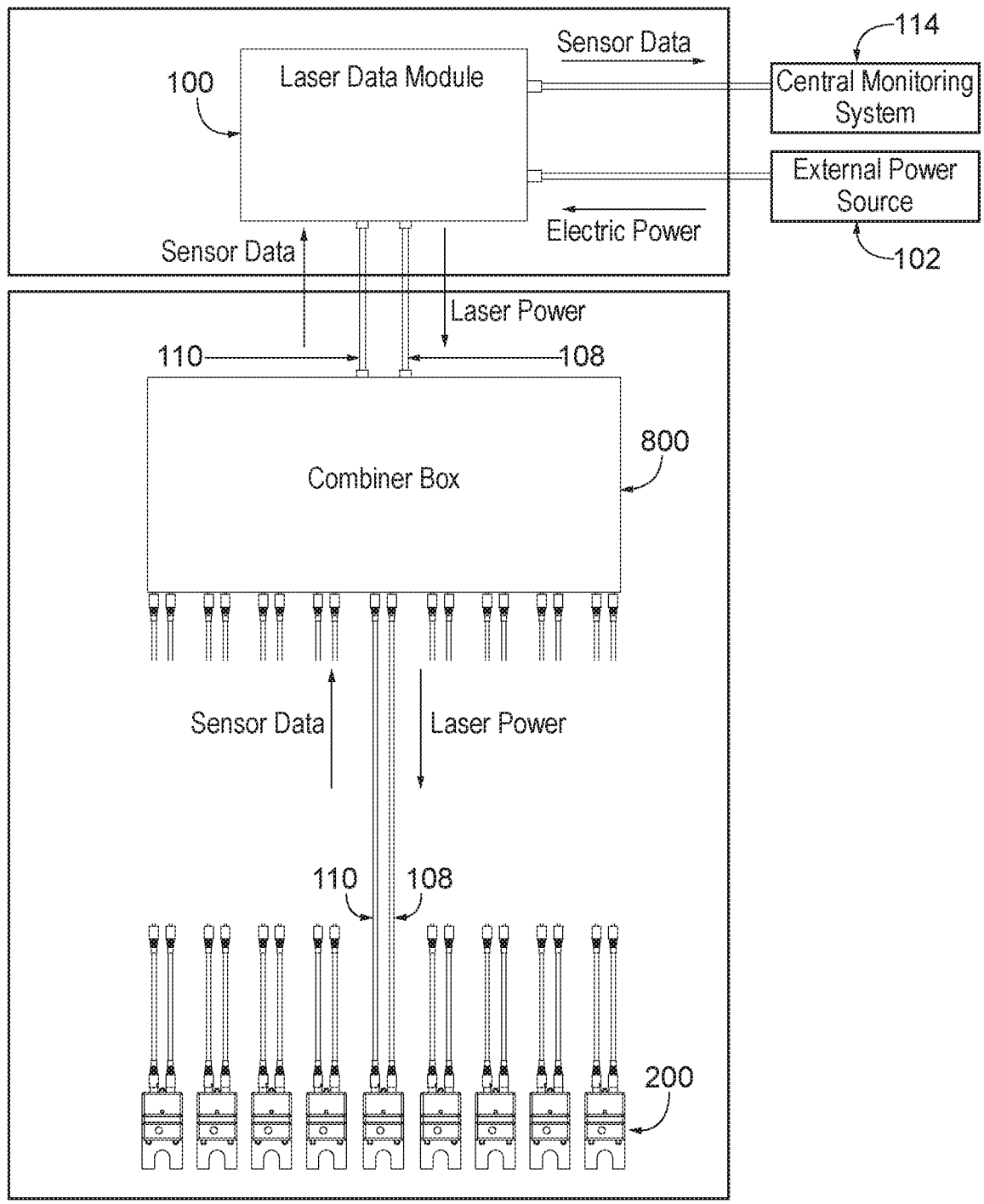
FIG. 8 is another schematic illustration of example connections between a laser data module and a plurality of sensor modules of a sensor system.

According to the embodiment of FIG. 8, the LDM 100 can also be used with a combiner box 800 located between the LDM 100 and the sensor modules 200. With such a configuration, the combiner box 800, rather than the LDM 100, splits a laser light output from the LDM 100 by a light source 106 therein into multiple channels to be distributed to each of a plurality of sensor modules 200. The combiner box 800 can also (de-)multiplex data signals transmitted between the LDM 100 and sensor modules 200.

A sensor module 200 may also be connected to another sensor module, via a fiber optic cable. As an example, the laser light from a fiber optic cable may go into a splitter which is near the sensor module. One of the fibers out of the splitter may go into the sensor module, while the other fiber is routed to a second sensor module further away. Then again, at the second sensor module, another splitter may split the laser light into two more fibers, one of which goes into the second sensor module, while the other fiber is routed to a third sensor module. This process can be continued, allowing many sensor modules to be connected together. This cabling approach has the benefit of reducing the number of fiber optic cables that must be run from the LDM to power each of the sensor modules. The splitters may be selected to route the same amount of light to each sensor module or to route differing ratios of laser light to each sensor module, as needed.

In another embodiment, batteries, capacitors, or other additional forms of energy storage may be added to the sensor module 200. The LDM 100 may send more laser power to the sensor module 200 than is needed for normal operation of the sensor module 200. The excess electricity generated by the PPC 202 may be stored in the energy storage device for later use. In one such embodiment, the PPC 202 within the sensor module 200 may not provide sufficient continuous power to allow all desired sensors to run continuously during normal operation. In this case, some sensors may be placed into low power mode, or in a dormant state, and may only be operated periodically. Any sensor can be configured to drawing on the excess power stored within the energy storage device to operate as needed.

Sensor Module Sensors

As described above, each sensor module 200 may include one or more of various sensors 204, 206, 208, 210 for detecting environmental conditions at the location of the sensor (i.e. sensed conditions). These sensors 204, 206, 208, 210 are powered by the electricity output from the PPC 202, which utilizes power supplied by the light source 106. The sensors 204, 206, 208, 210 may detect ambient temperature, surface temperature on a bus bar (or whatever surface it is mounted to), electromagnetic radiation, humidity, ultrasonic sounds, other sounds, pressure, vibrations, magnetic fields, electrical signals (voltage and/or current), flow rate, fiber sensors, and the like. Such sensors may include transducers such as thermocouples, thermistors, photodetectors, strain gauges, potentiometers, resistive elements, and the like. Each of the sensors may operate concurrently or sequentially and thus can detect, for example, temperature and light at the same time. Preferred sensors include temperature sensors, including ambient temperature sensors and surface temperature sensors, electromagnetic radiation sensors, such as those for detecting visible light, UV light, infrared light, gamma rays, radio waves (including UHF) and X-rays, humidity sensors, acoustic sensors including sound and ultrasonic sound sensors, pressure sensors, vibration sensors, flow rate sensors, and fiber sensors. Especially preferred sensors include acoustic sensors (including contact acoustic sensors and airborne acoustic sensors), light sensors, humidity sensors and temperature sensors. More preferably sensors are acoustic sensors, particularly acoustic sensors sensing a range of frequencies between 30 kHz and 400 kHz and those for sensing discrete bands of frequencies between 30 kHz and 400 kHz.

Furthermore, the sensor module 200 may use light (IR, UV, visible, etc.), sounds, ultrasonic sounds, radio waves, pressure, vibrations, magnetic fields, electrical signals, fiber sensors, or other ways of detecting PD, made possible by the voltage isolation of the PoF system. Sensors 204, 206, 208, 210 of the sensor module 200 that are powered via PoF and used to detect PD for the PD detection system may include one or more sensors of one or more types, including, for example, coupling capacitor sensors, radio frequency voltage sensors, radio frequency, current sensors, current transformers, voltage sensors, potential transformers, electro-optical transducers, antennas, fiber sensors, and high frequency current transformers (HFCT).

The sensors according to the present disclosure can be mounted internally within the powered sensor module housing, or externally away from the powered sensor module housing. In some embodiments, the sensor can be mounted to directionally point towards a probable detection location (e.g. towards points of mechanical contact). In some embodiments, particularly those comprising an externally mounted sensor, the sensor can be positioned or directed to be closer to a probable detection location than is the powered sensor module itself. In some embodiments, particularly those wherein the sensor is mounted internally within the sensor module housing, the sensor can extend through the housing to directionally point towards a probable detection location. In these ways, the sensors can provide information not only regarding the duration of a sensed condition, but the sensor can detect the directionality of a sensed condition or event. This information, in turn, can be used by the sensor system to determine the location, time, intensity and/or duration of the event.

Figure 9:
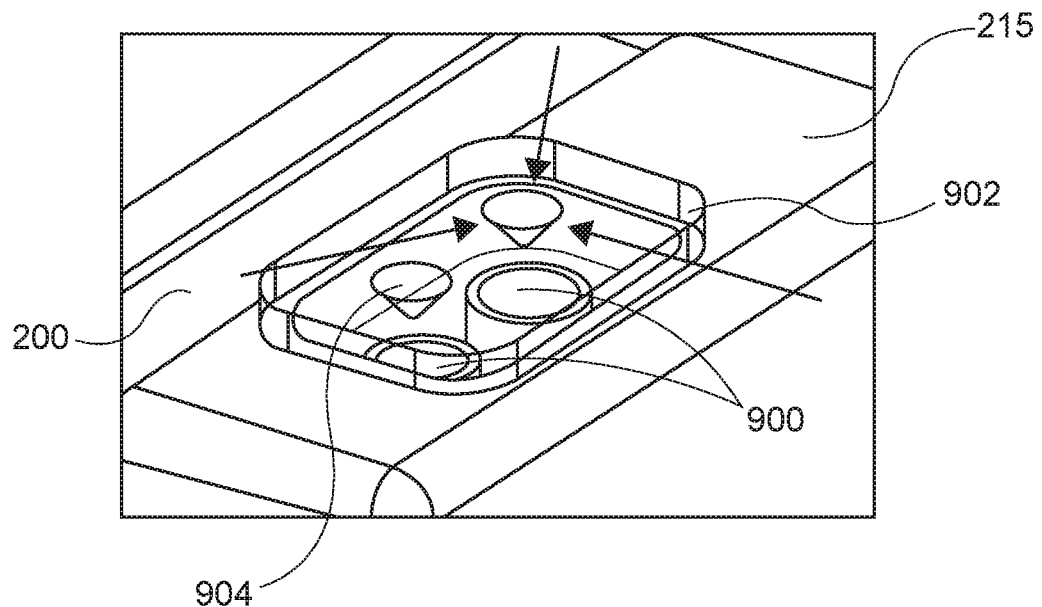
FIG. 9 is an example of a window in a sensor module for detecting light.
Figure 10:
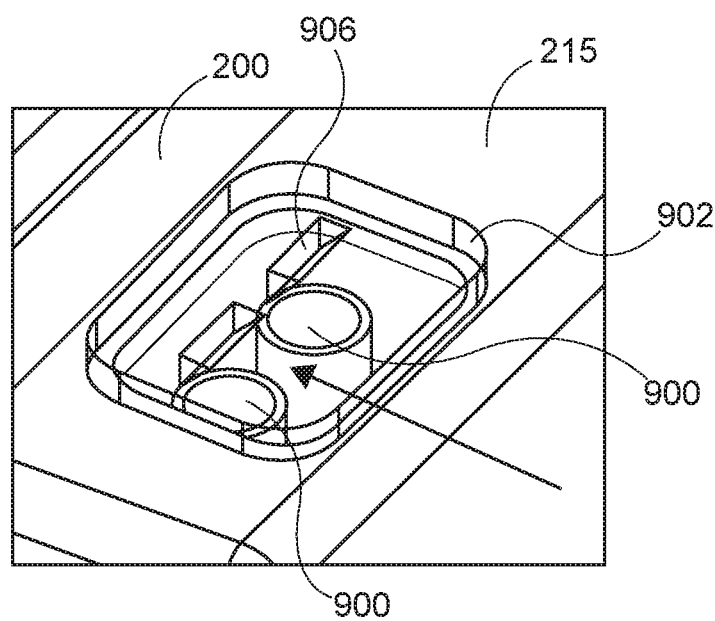
FIG. 10 is another example of a window in a sensor module for detecting light.

FIGS. 9 and 10 illustrate light detection in sensor modules 200 that may be used according to the present disclosure. For light detection, the sensors 204, 206, 208, 210 of the sensor modules 200 may include a photodetector(s) 900 for detecting one or more bandwidths of radiation (e.g., UV~240-405 nm emitted by a corona and ~400-700 nm emitted by a spark). The photodetectors 900 may detect intensity and duration of the light. One photodetector 900 may be used for each wavelength band, and/or multiple photodetectors 900, one for each band, may be used to help detect direction and intensity differences. The photodetectors may also be oriented in different directions (e.g., for directional photodetectors—those detecting light only from limited directions), rather than 360 degrees), or located remotely depending on the application. The photodetectors can be of various designs and shapes so as to best fit the desired functions. In a preferred embodiment, the sensor system comprises a light sensor comprising a first photodetector for detecting UV light and a second photodetector for detecting visible light.

As discussed above, in some embodiments the sensor module housing 215 can be clear (transparent) to allow light (energy) of a target wavelength to reach the sensors; or may be opaque and include a window 902. The window 902 may be transparent, frosted or colored. The window 902 may also be flush with the housing 215, or raised above the housing 215 as illustrated in FIGS. 9 and 10. In some embodiments, the window 902 may be flat, and/or have light directing feature 904, 906 to allow light to enter from one or multiple directions depending on directing feature's shape. For example, a cone-shaped light detecting feature 904 is illustrated in FIG. 9. The cone-shaped features 904 are formed in a window 902 above photodetectors 900, and by their shape, may direct light from any direction (as shown by the arrows) toward the photodetector 900. The embodiment illustrated in FIG. 10 shows prism-shaped light-detecting features 906. By their shape, these features 906 may direct light from particular directions (as shown by the arrow) toward the photodetectors 900 and may provide directional information as to where the PD event occurred.

In an alternate embodiment, the sensor system of the present disclosure can be configured as "customizable," that is, it can include the required power and communications components, including an LDM 100 and the powered sensor module 200 similar to those previously discussed, but allow for the end user to select and integrate or attach its application-specific sensors with the sensor module 200 through a standard communications interface. In this regard, it is a sensor system comprising an LDM 100 and a powered sensor module 200. The LDM includes a light source 106, such as those discussed above. The LDM 100 and the powered sensor module 200 are operatively connected via one or more fiber optic cable(s) 108, 110. As discussed above, the powered sensor module 200 receives light from the light source 106 of the LDM 100 and converts that light to electrical power. The electrical power is then used to power one or more sensors, or other electronic components, that have been incorporated into the sensor module 200 by the end user. In one embodiment, the sensors to be incorporated by the end user are connected to the power sensor module 200 by one or more fiber optic cables.

It is noted that any of the aspects or combination of aspects described above may be implemented or controlled via hardware or software. For example, these aspects may be implemented on a processor or a plurality of processors. These processor(s) also may be embedded or integrated with other processors designed for a separate purpose, for example, as part of a central processing unit (CPU).

A "processor" as used herein refers to any, or part of any, electrical circuit comprised of any number of electrical components, including, for example, resistors, transistors, capacitors, inductors, and the like. The circuit may be of any form, including, for example, an integrated circuit, a set of integrated circuits, a microcontroller, a microprocessor, a collection of discrete electronic components on a printed circuit board (PCB) or the like. The processor may also stand alone or be part of a computer. Implementation of these aspects may by hardware or software may be realized in any number of electronic devices and/or applications, including but not limited to, personal computers, servers, mobile phones, and the like. Moreover, the above aspects and/or combination of aspects may be stored in memory which is executable by one of said processors. In one embodiment, the sensor system comprises a digital signal processor integrated circuit that can be configured to sample continuously or configured to sample at specific time bands of data. In this latter configuration, the data transfer rate can be reduced, resulting in an overall power savings. It is also to be noted that the above description is non-limiting, and the examples are but only a few of many possible processors and implementations envisioned.

Although the hereinabove described embodiments of the invention constitute preferred embodiments, it should be understood that modifications can be made thereto without departing from the spirit and the scope of the invention as set forth in the appended claims.

What is claimed is:
1. A sensor system comprising:
a laser data module;
a powered sensor module comprising a photovoltaic power converter; and a first sensor mounted internally or externally to the powered sensor module,
wherein the powered sensor module receives a light, converts the light to electrical power, and powers the first sensor with the electrical power,
wherein the powered sensor module transmits signals from the first sensor to the laser data module, and
wherein the first sensor transfers data using a digital signal processor integrated circuit configured to reduce the data transfer rate.

2. The sensor system of claim 1, wherein the powered sensor module is operatively connected to the laser data module via a fiber optic cable.

3. The sensor system of claim 1, wherein the laser data module comprises a light source.

4. The sensor system of claim 3, wherein the light source is a continuous laser, a pulsed laser or an LED.

5. The sensor system of claim 1, wherein the first sensor is selected from the group consisting of: an ambient temperature sensor, a surface temperature sensor, an electromagnetic radiation sensor, a light sensor, a humidity sensor, an acoustic sensor, an ultrasonic sound sensor, a pressure sensor, a vibration sensor, a magnetic field sensor, an electrical signal sensor, a flow rate sensor and a fiber sensor.

6. The sensor system of claim 5, wherein the first sensor is an acoustic sensor, a light sensor, a humidity sensor, or a temperature sensor.

7. The sensor system of claim 6, wherein the first sensor is a light sensor comprising a first photodetector that detects ultraviolet light and a second photodetector that detects visible light.

8. The sensor system of claim 6, wherein the first sensor is an acoustic sensor.

9. The system of claim 8, wherein the acoustic sensor is a contact acoustic sensor or an airborne acoustic sensor.

10. The sensor system of claim 1, wherein the powered sensor module further comprises a memory and a system processor configured to transfer select data samples or specific time bands of data and to combine the data from multiple sensor inputs.

11. The sensor system of claim 1, wherein the photovoltaic power converter comprises a photovoltaic cell.

12. The sensor system of claim 11, wherein the photovoltaic cell is a vertical multi junction photovoltaic cell.

13. The sensor system of claim 1, wherein the laser data module is located in a low voltage compartment and the powered sensor module is located in a medium or high voltage compartment.

14. The sensor system of claim 13, wherein the low, medium or high voltage compartments are compartments of a switchgear cabinet.

15. The sensor system of claim 13, wherein the powered sensor module is mounted directly on a bus bar or proximate to mechanical fingers of a breaker arm.

16. The sensor system of claim 1, comprising a plurality of sensors.

17. The sensor system of claim 1, wherein the powered sensor module detects a sensed condition.

18. The sensor system of claim 17, wherein the first sensor is able detect a directionality of the sensed condition.

19. The sensor system of claim 18, wherein the sensor system determines a location, time, intensity, and/or duration of a sensed condition.

20. The sensor system of claim 1, wherein the powered sensor module further comprises additional energy storage.

21. The sensor system of claim 1, wherein the first sensor is mounted internally within the powered sensor module to directionally point towards a detection location.

22. The sensor system of claim 21, wherein the first sensor extends thru a housing of the powered sensor module to directionally point towards the detection location.

23. The sensor system of claim 1, wherein the powered sensor module further comprises one or more externally located sensors positioned or directed to be closer to a detection location than is the powered sensor module.

24. The sensor system of claim 1, wherein the powered sensor module further comprises a housing including a metal shield on the inside of the housing.

25. The sensor system of claim 24, further comprising opening in the metal shield configured to allow external signals to reach the sensor.

26. The sensor system of claim 1, wherein the laser data module simultaneously powers and monitors output from the powered sensor module.

27. The sensor system of claim 26, further comprising a second powered sensor module, wherein the powered sensor modules are configured to operate at different power levels and data communication rates.

28. The sensor system of claim 1, wherein the powered sensor module operates in low power mode between each sensor reading.

29. The sensor system of claim 1, wherein the laser data module further comprises a signal processor configured to interpret sensor data and alert when specified threshold limits are exceeded.

30. The sensor system of claim 1, wherein the powered sensor module further comprises a signal processor configured to interpret sensor data and alert when specified threshold limits are exceeded.

31. The sensor system of claim 30, wherein the powered sensor module comprises a plurality of signal processors, wherein at least one signal processor is configured to simultaneously interpret data from multiple sensors and alert when specified threshold limits are exceeded, and wherein at least one signal processor is utilized for external communications.

32. The sensor system of claim 31, wherein one of the signal processors is configured to interpret sensor signals from one or more sensors and to further process the signals to determine when fiber breaks or disconnects have occurred.

33. The sensor system of claim 1, wherein a continuous stream of data is provided to the laser data module from the powered sensor module.

34. The sensor system of claim 33, wherein the laser data module is configured to detect a loss of data, wherein the loss of data signals a break or disconnect of a fiber optic cable.

35. The sensor system of claim 34, wherein the laser data module is configured to terminate or fail to initialize power upon the loss of data.

36. The sensor system of claim 1, the laser data module comprising a class 4 laser, the Class 4 laser spilt into multiple lower power Class 1 laser channels.

37. The sensor system in claim 36, wherein an output of the multiple lower power Class 1 laser channels can be configured to provide different power levels to a plurality of powered sensor modules based on a need of the powered sensor modules during operation.

38. The sensor system in claim 36, wherein an output of the multiple lower power Class 1 laser channels can be configured to provide varying power levels to a plurality of powered sensor modules based on a need of the powered sensor modules during operation.

39. A sensor system comprising:
a laser data module comprising a Class 4 laser light source split into a plurality of lower power Class 1 laser channels, each of the lower power Class 1 laser channels being configured to provide a different power level to a different one of a plurality of powered sensor modules over a different one of a plurality of optical fiber channels based on a need of the powered sensor module during operation,
wherein each of the powered sensor modules comprises a photovoltaic power converter and a sensor configured to operate a different sampling rate, the photovoltaic power converter being configured to receive a light from the corresponding one of the Class 1 laser channels, convert the received light to electrical power, and power the sensor with the converted electrical power, and
wherein the laser data module is further configured to receive a light transmitted from each of the powered sensor modules, the received light indicating a condition sensed by the corresponding powered sensor module, and
wherein the sensor of at least one of the powered sensor modules transfers data using a digital signal processor integrated circuit configured to reduce the data transfer rate.

* * * * *